(12) United States Patent
Bockelman et al.

(10) Patent No.: US 7,728,661 B2
(45) Date of Patent: Jun. 1, 2010

(54) CONTROLLING POWER WITH AN OUTPUT NETWORK

(75) Inventors: David E. Bockelman, Dripping Springs, TX (US); Vishnu Srinivasan, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 23 days.

(21) Appl. No.: 12/151,199

(22) Filed: May 5, 2008

(65) Prior Publication Data

US 2009/0273397 A1 Nov. 5, 2009

(51) Int. Cl.
*H03F 1/14* (2006.01)
*H03F 3/68* (2006.01)

(52) U.S. Cl. ............... 330/51; 330/124 R; 330/195
(58) Field of Classification Search ............... 330/51, 330/124 R, 195
See application file for complete search history.

(56) References Cited

U.S. PATENT DOCUMENTS

| | | | |
|---|---|---|---|
| 4,580,111 A | 4/1986 | Swanson | |
| 4,593,251 A | 6/1986 | Smith | |
| 4,680,559 A | 7/1987 | Swanson | |
| 5,264,810 A * | 11/1993 | Sager et al. | 333/131 |
| 5,570,062 A * | 10/1996 | Dent | 330/51 |
| 5,872,481 A | 2/1999 | Sevic et al. | |
| 5,930,128 A * | 7/1999 | Dent | 363/43 |
| 6,069,525 A | 5/2000 | Sevic et al. | |
| 6,294,955 B1 * | 9/2001 | Luu et al. | 330/51 |
| 6,731,166 B1 | 5/2004 | Sabouri et al. | |
| 6,996,379 B2 | 2/2006 | Khorram | |
| 7,079,818 B2 | 7/2006 | Khorram | |
| 7,095,283 B2 | 8/2006 | Kee et al. | |
| 7,129,784 B2 | 10/2006 | Bhatti et al. | |
| 7,157,965 B1 | 1/2007 | Kim | |
| 7,215,206 B2 | 5/2007 | Dupuis et al. | |
| 7,365,602 B2 * | 4/2008 | Bhatti et al. | 330/295 |
| 2005/0189995 A1 | 9/2005 | Kee et al. | |
| 2007/0096831 A1 | 5/2007 | Gao et al. | |

FOREIGN PATENT DOCUMENTS

EP 01229642 8/2002

OTHER PUBLICATIONS

U.S. Appl. No. 12/151,812, filed May 9, 2008, Entitled "Supply Control for Multiple Power Modes of a Power Amplifier," by Vishnu Srinivasan, et al.
U.S. Appl. No. 12/317,819, filed Dec. 30, 2008, Entitled "An Output Gain Stage for a Power Amplifier," by Vishnu Srinivasan, et al.

(Continued)

*Primary Examiner*—Steven J Mottola
(74) *Attorney, Agent, or Firm*—Trop, Pruner & Hu, P.C.

(57) ABSTRACT

In one embodiment, the present invention includes multiple gain stages and an output network coupled to the gain stages. Each of the gain stages can be independently controlled to amplify a radio frequency (RF) signal to an output power level for transmission from a mobile wireless device. When controlled to be inactive, at least one of the gain stages can be placed into a low impedance state.

27 Claims, 16 Drawing Sheets

OTHER PUBLICATIONS

RF Micro Devices, Inc., "RF2173, 3V GSM Power Amplifier, Package Style: QFN, 16-Pin, 4 x 4," 2006, pp. 1-14.

RF Micro Devices, Inc., "What's Next in UMTS Front-Ends," 2007, pp. 1-2.

Anadigics, "AWT6278R, HELP3™ PCS/WCDMA 3.4 V/29.5 dBm, Linear Power Amplifier Module, Data Sheet—Rev. 2.0," Jan. 2007, pp. 1-8.

PCT/US2009/036480 International Search Report dated Sep. 28, 2009.

* cited by examiner

CONTROLLING POWER WITH AN OUTPUT NETWORK

BACKGROUND

In many wireless communication systems, a mobile wireless device such as a cellular telephone, mobile internet device (MID), personal digital assistant (PDA), laptop, personal computer and so forth communicates wirelessly at a radio frequency (RF). To enable communication in a given wireless communication system, such devices are required to output an RF signal having a given power level. Different wireless systems have different requirements for power levels, and furthermore in a given communication system, power levels may vary depending on communication mode. To generate output power needed for transmitting information, typical mobile devices include a power amplifier (PA) or other such amplifier that receives RF signals from processing circuitry of the device, such as a baseband processor and transceiver or so forth, and amplifies this RF signal to a required power level.

Due to power control requirements in many transmitter systems, average output power can vary over a wide range, for example, several tens of decibels (dBs). This makes a power amplifier's efficiency change dramatically over the power range. Most PA's have maximum efficiency at maximum output power, and efficiency drops rapidly as power is reduced.

SUMMARY OF THE INVENTION

According to one aspect, the present invention includes an apparatus with multiple gain stages and an output network coupled to the gain stages. Each of the gain stages can be independently controlled to amplify a radio frequency (RF) signal to an output power level for transmission from a mobile wireless device such as a cellular handset or so forth. When controlled to be inactive, at least one of the gain stages can be placed into a low impedance state. Each of the gain stages can have substantially different drive point impedances when they are active, to accommodate different output power levels. In one implementation, the output network may include a transformer.

Another aspect of the present invention is directed to a power amplifier that has multiple stages each including pairs of amplifiers and a transformer coupled to each of the stage outputs, where the transformers have different turns ratios. The stages may be controlled such that when a given stage is inactive, it can be placed into a low impedance state, and a net inductance is switched to be coupled in parallel to an output coil of the opposite transformer.

Yet another aspect of the present invention is directed to an integrated circuit that includes at least three gain stages and at least three transformer, each coupled to a corresponding one of the gain stages. At least two of the transformers may have substantially equal turns ratios that in turn are greater than a turns ratio of another of the transformers. The gain stages can be individually enabled, and at least two of the stages may correspond to a high power gain path, while another stage corresponds to a low power gain path.

A still further aspect of the present invention is directed to a power amplifier that has multiple differential complementary amplifier stages and an output transformer. The output transformer may be coupled to receive an amplified output signal from any of the amplifier stages, depending on which is enabled. A turns ratio of the output transformer may also be dependent upon which of the amplifier stages is enabled. In some implementations, the non-enabled amplifier stage(s) can be placed into a high impedance state.

Still further, an aspect of the present invention is directed to an integrated circuit that includes, in addition to multiple gain stages, multiple transformers. The transformers may each have substantially equal turns ratios and include coils formed of inductors integrated on a common complementary metal-oxide-semiconductor (CMOS) die with the gain stages. More specifically, the inductors can be sized to manage inductance variation of a CMOS process, and the transformers can enable the gain stages to see a drive point impedance that is substantially less than a load impedance of a load to which the circuit is coupled.

DETAILED DESCRIPTION

Embodiments may provide an output network that can provide a controllable load impedance. In this way, the output power/efficiency reduction problem can be overcome. By increasing load impedance as the desired output power decreases, efficiency can be kept near a maximum value.

In various embodiments, different implementations of an output network coupled to an output gain stage of a power amplifier or other such amplifier device may be provided. Such output networks may aid in controlling output power while allowing for operation in high efficiency modes. That is, output power ($P_{out}$) of an amplifier is related to load resistance and output voltage according to the following equation:

$$P_{out} = V_{RMS}^2 \div R_L \quad [\text{EQ. 1}]$$

where $V_{RMS}$ corresponds to a RMS output voltage level and $R_L$ is the load resistance. The maximum output power, and the maximum efficiency, occurs when $V_{RMS}$ is maximized. The maximum value of $V_{RMS}$ is proportional to the supply voltage, with the actual maximum value determined in part by various performance requirements such as linearity or harmonic level. In different implementations, various manners of controlling power by controlling load resistance can be realized using an output network in accordance with an embodiment of the present invention. For example, an output network may provide high efficiency at two or more power levels. In these cases, the output network can provide optimal (or approximately optimal) loads for the gain stage amplifiers, thereby enabling high efficiency operation at the two or more power levels. Also, the networks provide a means by which different power levels can be selected electronically. Thus, the network can be called a reconfigurable output network. In various embodiments, the impedance presented by disabled gain stages can be used to control, or partially control, the state of the reconfigurable output network.

To enable load variations in accordance with an embodiment of the present invention, a transformer-based technique can be used to electrically reconfigure a transformer of an output network to change its turns ratio. This reconfiguration has the effect of changing the load impedance, and is done so that the transformer's RF performance is maintained.

Figure 1:
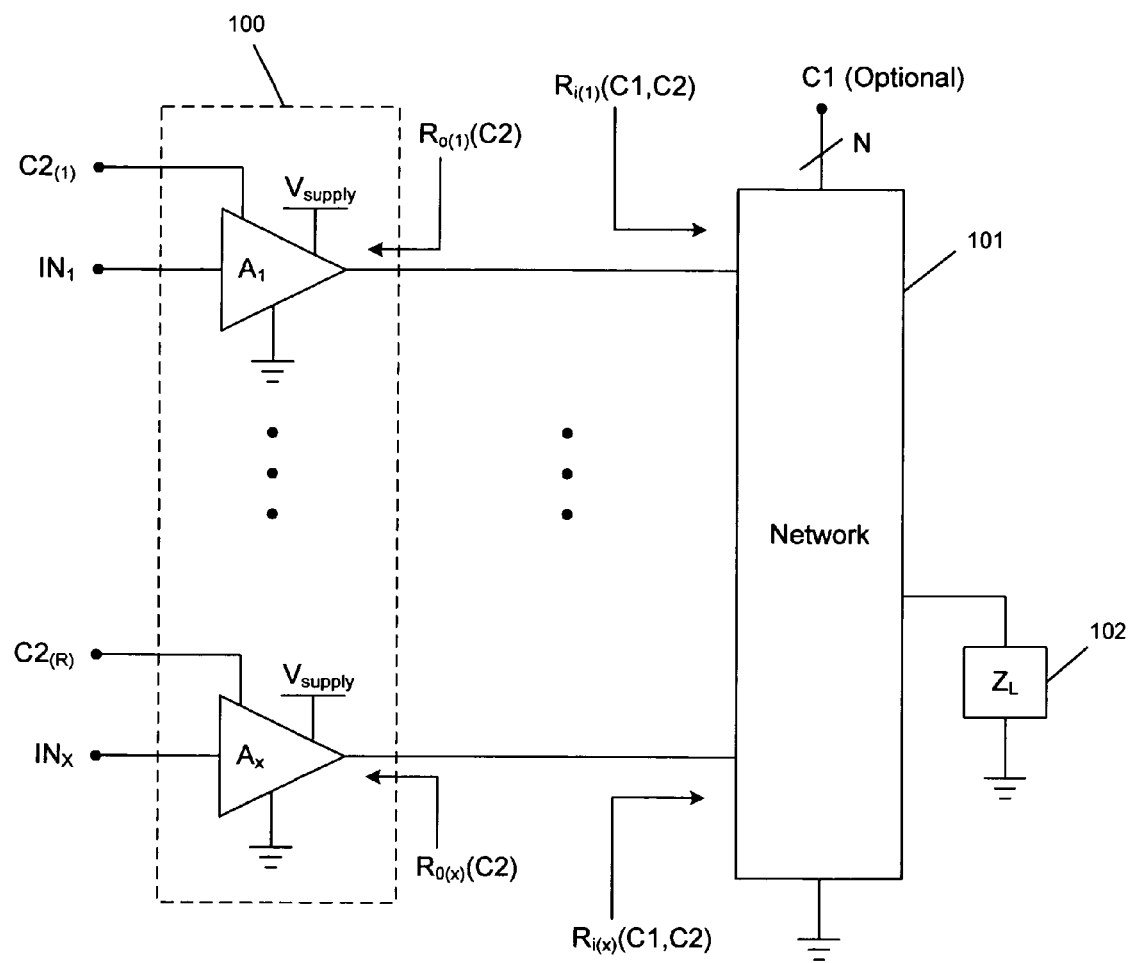
FIG. 1 is a conceptual schematic diagram of a power amplifier output stage and output network in accordance with the present invention.

Referring now to FIG. 1, shown is a conceptual schematic diagram of the final stages of a power amplifier with a reconfigurable load in accordance with one embodiment of the present invention. A final gain stage 100 may include two or more parallel gain stages, A(x) generically, which connect to an output network 101. The gain stages may be of differential or single-ended topology. One or more of the gain stages may be controlled by signals, C2(x). Similarly, the output network may have various control signals, C1(x), that modify the response of the output network. The control signals C2(x) may enable or disable the gain stages and may also control the output impedance presented by the gain stages, Ro(x)(C2).

For example, the signal C2(1) may cause the output impedance Ro(1) to be at a high impedance level when gain stage A1 is disabled. Since the various signal paths are connected to network 101, the drive-point impedance of each gain stage is a function of all control signals, hence the name Ri(x)(C1, C2). By changing the control signals C1 and C2, the effective load impedance presented to the various enabled gain stage(s) can be changed, allowing for high efficiency operation at various output power levels. The output network 101 may also provide an impedance match to an external load 102.

Figure 2:
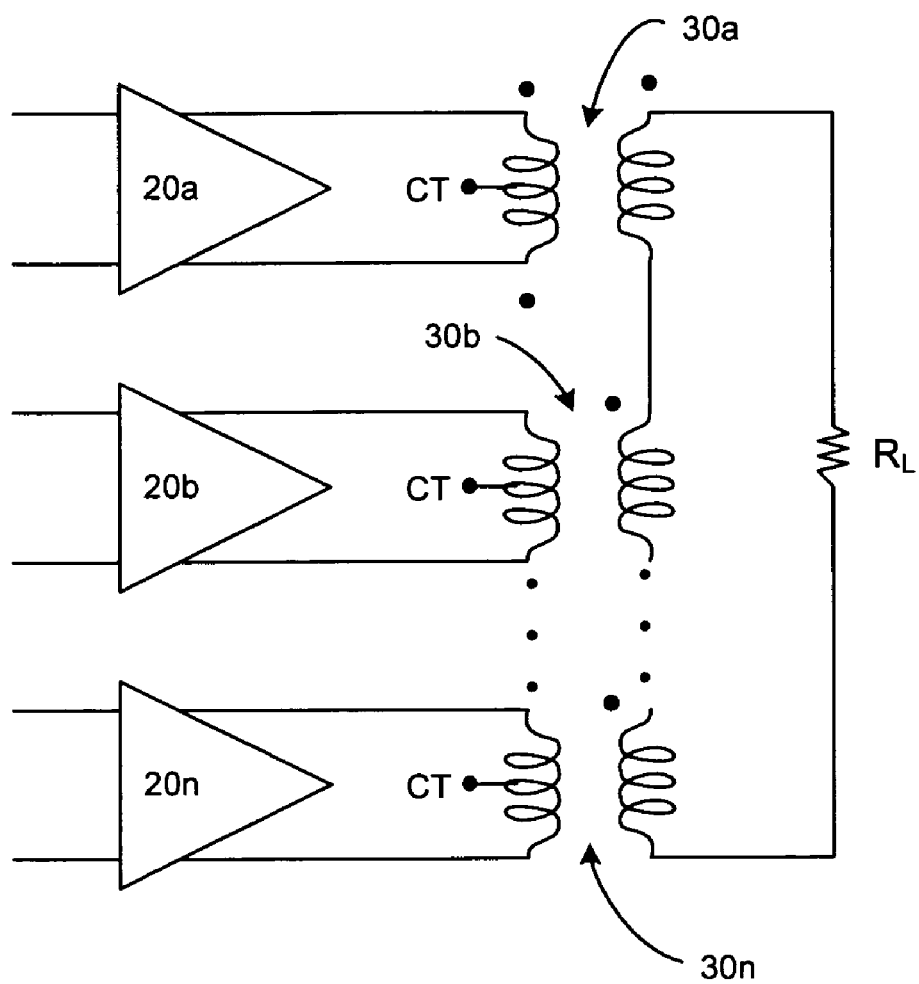
FIG. 2 is a conceptual schematic diagram of an output network in accordance with one embodiment of the present invention.

Referring now to FIG. 2, shown is a conceptual schematic diagram of an output network in accordance with one embodiment of the present invention. As shown in FIG. 2, output network 10, which may be part of a PA, includes a plurality of different paths or slices. Specifically, multiple amplifiers $20_a$-$20_n$ (generically amplifier 20) each of which may be a gain stage formed of one or more transconductance amplifiers may be present. In one embodiment, gain stages 20 are complementary metal oxide semiconductor (CMOS) stages each including a pair of complementary metal oxide semiconductor field effect transistors (MOSFETs), namely a p-channel MOSFET (PMOS) and an n-channel MOSFET (NMOS). The gain stages may have differential outputs coupled to a primary coil of a corresponding transformer $30_a$-$30_n$ (generically transformer 30). In turn, the secondary coil of transformers 30 are coupled to a load resistance $R_L$. As will be described further below, depending upon a mode of operation, e.g., a high power mode or low power mode, one or more of amplifiers 20 may be inactive. Note that individual transformers can have different turns ratios, or all the same. Unused amplifiers can be forced to be in a high impedance (Hi-Z) or a low impedance (Lo-Z) mode. In different implementations primaries can be strongly coupled to each other or not. If the primaries are strongly coupled, the unused amplifiers are placed in a Hi-Z state or large losses may ensue. If there are different turns ratios, then some unused amplifiers (with low turns ratio transformers at their output) will see large voltages when in Hi-Z state. In other embodiments, the transformer can be weakly magnetically coupled, or not coupled at all. As used herein, with such weakly coupled primaries, the unused amplifier may be placed in a Lo-Z state. In such a case, the Lo-Z state the high voltages may be eliminated, while not causing high signal losses. The primaries can be each made with a center tap, allowing independent control of bias voltages for each amplifier, such that turning off one or more amplifier can reduce quiescent current.

Figure 3A:
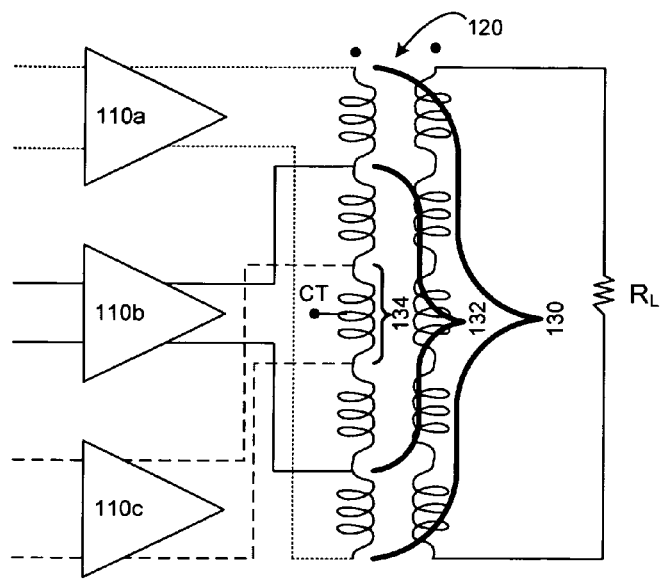
FIG. 3A is a conceptual schematic diagram of a multi-tap transformer implementation in accordance with one embodiment of the present invention.

Referring now to FIG. 3A, shown is a conceptual schematic diagram of an output network in accordance with another embodiment of the present invention. Specifically, as shown in FIG. 3A, output network 100 includes a multi-tap transformer 120 having a primary coupled to outputs of a plurality of differential amplifiers $110_a$-$110_c$ (generically amplifier 110). Each gain stage may be a CMOS gain stage formed of a complementary pair of transconductance amplifiers. While shown with only three amplifier paths or slices in the embodiment of FIG. 3A, understand that in other implementations more or fewer such paths are possible. As shown in FIG. 3A, each amplifier 110 has outputs coupled to a different tap location of primary 120. In this way, a turns ratio between primary and secondary of transformer 120 can be adjusted by selecting which of amplifiers 110 are active. Specifically, amplifier $110_a$, which may correspond to an amplifier of a low power path, is coupled to the full extent of the primary of transformer 120, represented by tap connections at the top and bottom of the primary of transformer 120, and exemplified by the width of spacing 130. Similarly, amplifier $110_b$ may be a medium power amplifier and is coupled to mid-tap connections represented by a width 132. In turn, amplifier 110$_c$, which may correspond to an amplifier of a high power path, may be coupled to tap locations that provide the smallest number of turns, thus providing a largest turns ratio (between secondary and primary) for transformer 120. The width of the primary to which amplifier 110$_c$ is coupled is exemplified by width 134.

By selecting one or more of the amplifiers for activation, the turns ratio may be adjusted and accordingly so too is the output impedance, thus controlling output power by switching in the selected one or more amplifiers 110. Note that in the embodiment of FIG. 3A, all amplifiers share a single center-tap. In implementations in which primary taps are highly coupled (i.e., have a coupling coefficient k close to 1), "shorting" any taps to a ground potential or another tap reflects a low impedance across all other taps, resulting in a change of impedance as seen by "active" amplifiers, and high losses in the network. For this reason, unused amplifiers may be put in the Hi-Z mode. Other taps (in Hi-Z) will see a voltage that is "gained up" from a driven path of inner taps, with a gain corresponding (approximately) to the turns ratio between the taps. Note that, while not shown in the figures, the transformers may have capacitors in parallel with the windings to provide an impedance match at a desired operating frequency.

In various implementations, the size (i.e., transistor area) of amplifiers 110$_b$ may be related to the area of amplifier 110$_a$ according to:

$$A_{110b} = (N_{low}/N_{med})^2 \times A_{110a} \quad \text{[EQ. 2]}$$

where $N_{low}$ is proportional to the number of turns of the primary coil corresponding to the low power path, and likewise for $N_{med}$. Of course, other sizes and configurations of a transformer and gain stages may be implemented in other embodiments.

Figure 3B:
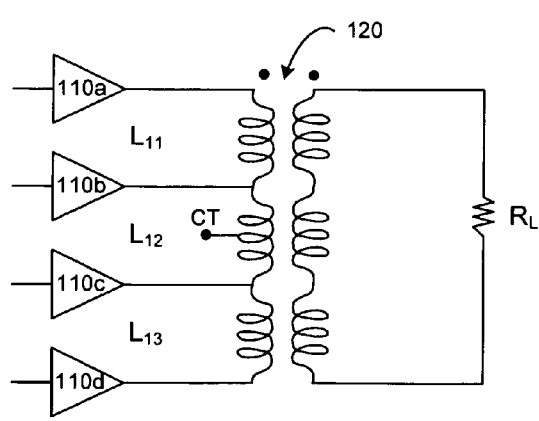
FIG. 3B is a conceptual schematic diagram of another multi-tap transformer implementation in accordance with an embodiment of the present invention.
Figure 3C:
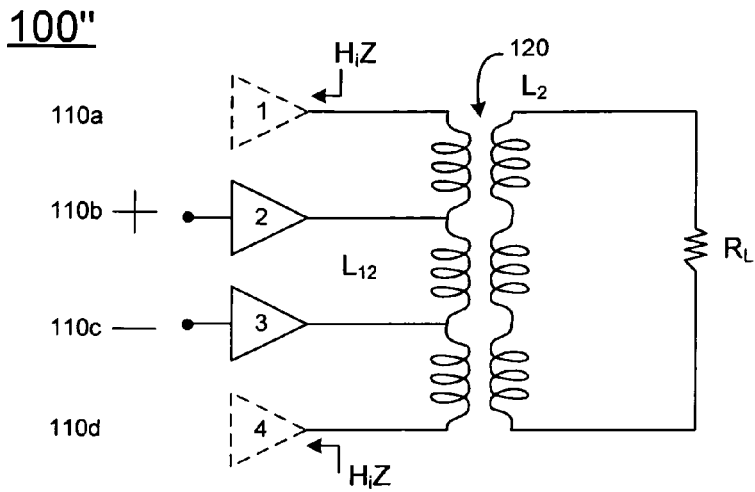
FIG. 3C is an equivalent schematic of the circuit of FIG. 3B in a high power mode of operation.

Referring now to FIG. 3B, shown is a conceptual schematic diagram of another multi-tap transformer implementation in accordance with an embodiment of the present invention. In this embodiment, the differential amplifiers are formed of two approximately identical single-ended amplifiers. As shown in FIG. 3B, output network 100' includes a multi-tap transformer coupled to multiple amplifiers 110$_a$-110$_d$, pairs of which form differential gain stages. Thus, the pair of single-ended amplifiers 110$_a$ and 110$_d$ form one differential amplifier. By coupling different ones of these amplifiers 110 to the primary of transformer 120, different turns ratios can be established to effect different output impedances. Each amplifier 110 may be a CMOS amplifier formed of a complementary pair of transconductance amplifiers. As shown in FIG. 3B, amplifiers 110$_a$-110$_d$ have corresponding areas $A_1$-$A_4$. In various implementations, the size of amplifiers 110$_a$ and 110$_d$ may be substantially equal. Similarly, amplifiers 110$_b$ and 110$_c$ may also be substantially equal. The windings shown in FIG. 3B corresponding to $L_{11}$, $L_{12}$ and $L_{13}$, which form the primary of transformer 120, may have losses and are coupled by a coupling coefficient, k. Assume for purposes of discussion that transformer 120 can have two states: a high turns ratio state, and a low turns ratio state. For a high turns ratio state, amplifiers 110$_a$ and 110$_d$ are biased "off" so that their output impedance is high. As shown in FIG. 3C, amplifiers 110$_a$ and 110$_d$ are biased off and are controlled such that their output impedances are high (i.e., Hi-Z). Gain stages 110$_b$ and 110$_c$ are biased on and are driven differentially. Accordingly, the primary inductance of transformer 120 is $L_{12}$. Thus the impedance ratio of the transformer (which is approximately the square of the turns ratio) is $L_2/L_{12}$. In various embodiments, $L_{12}$ may be relatively small such that the turns ratio in this state, which may correspond to a high power state, $N_{high}$, may be large (4 or higher for example). Note that the mutual inductance in this arrangement between $L_2$ and $L_{12}$ is maximized. Amplifiers 110$_b$ and 110$_c$ are "on" and are driven differentially.

Figure 3D:
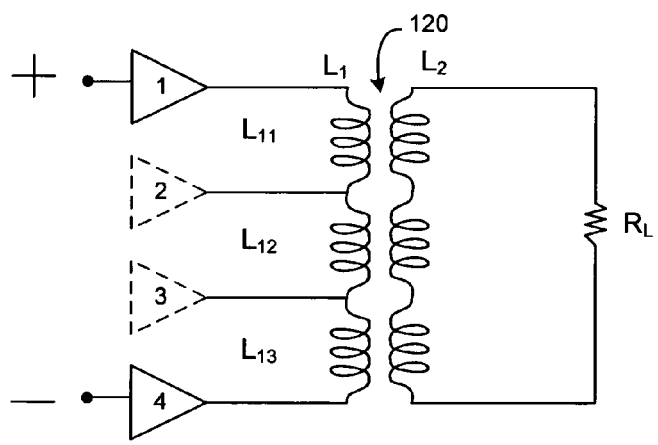
FIG. 3D is an equivalent schematic of the circuit of FIG. 3B in a low power mode of operation.

In contrast, for the low turns ratio state, as shown in FIG. 3D amplifiers 110$_b$ and 110$_c$ are biased "off," i.e., with Hi-Z output impedances. Amplifiers 110$_a$ and 110$_d$ are "on" and driven differentially. Accordingly, the primary inductance $L_1$ corresponds to the total inductance of the primary of transformer 120 shown in FIG. 3D, namely $L_{11}+L_{12}+L_{13}+M$, where M is the composite mutual inductance seen by the various primary coils. In various implementations this total inductance $L_1$ may be substantially equal to $L_2$ such that the turns ratio is one or substantially equal to one. In other embodiments, the turns ratio may less than one. Note in this implementation the mutual inductance between $L_1$ and $L_2$ is maximized.

Note that when an unused amplifier is placed into the Hi-Z state, the output capacitance does not significantly change, and thus the unused tap is still tuned. In some implementations, switchable capacitors may be used on other taps to shift tuning while unused.

Figure 3E:
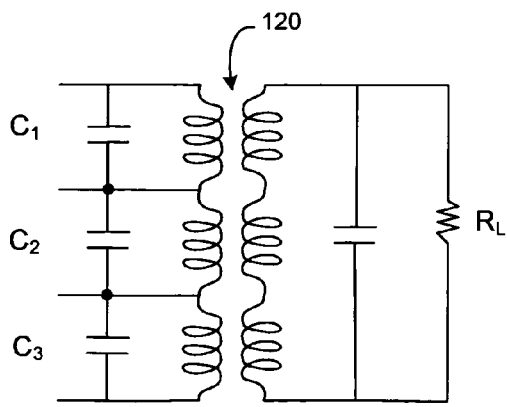
FIG. 3E is an implementation of a tuning circuit that can be used in connection with a multi-tap transformer.

Referring now to FIG. 3E, shown is an implementation of a tuning circuit that can be used in connection with a multi-tap transformer. Specifically, as shown in FIG. 3E, transformer 120 may have capacitances coupled in parallel on both its primary and secondary sides. Specifically, parallel capacitances C1, C2 and C3 may each be coupled between a pair of nodes that are coupled to intermediate tap points of the primary. In some implementations, capacitors C1-C3 may be implemented using adjustable capacitors. Furthermore, such capacitors may be partially comprised of the output capacitance of the corresponding amplifier (not shown in FIG. 3E).

Figure 4A:
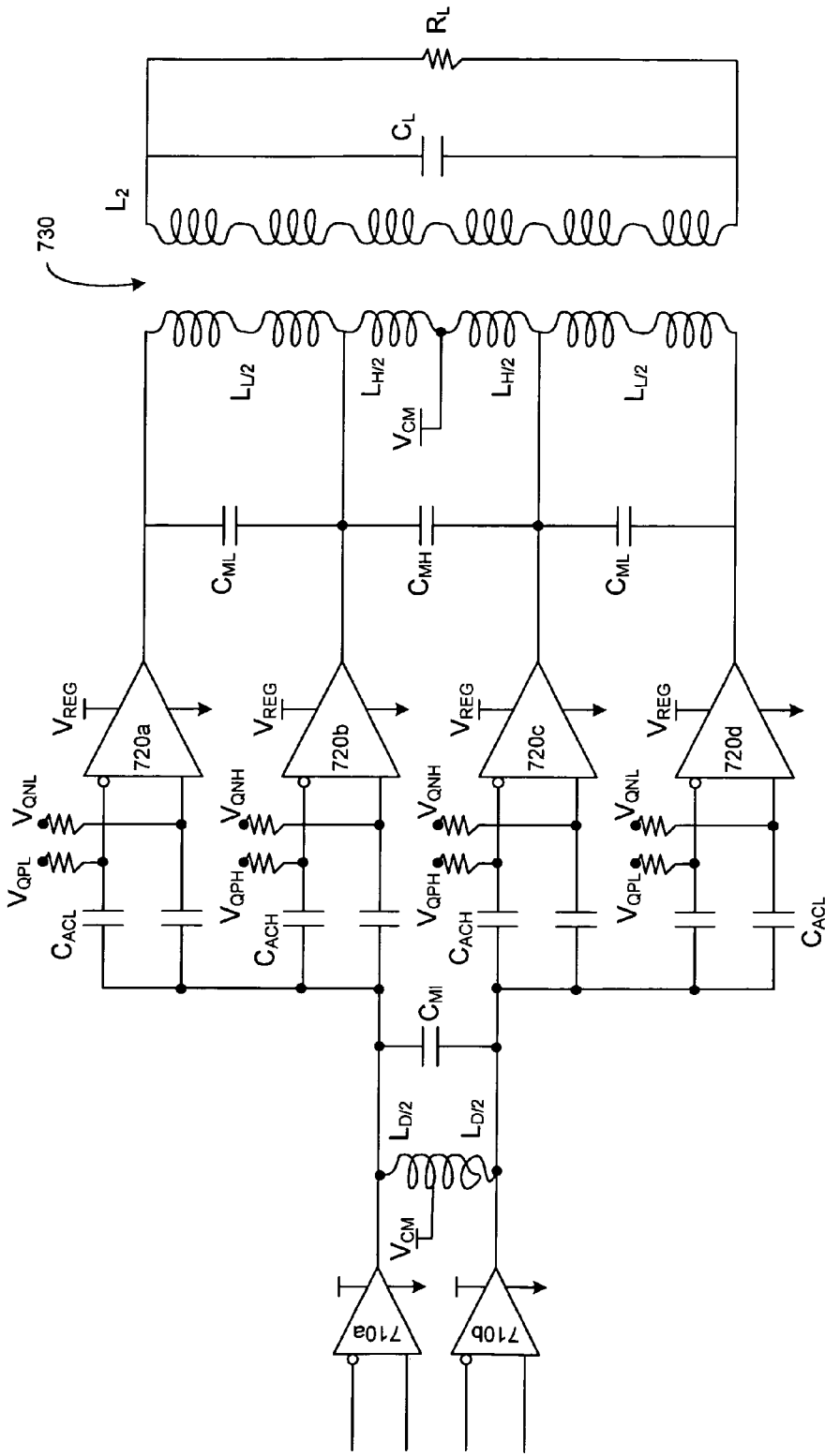
FIG. 4A is a conceptual schematic diagram of parallel gain stages and an output network in accordance with an embodiment of the present invention.

Referring now to FIG. 4A, shown is a conceptual schematic diagram of parallel gain stages and an output network in accordance with an embodiment of the present invention. As shown in FIG. 4A, circuit 700 includes driver stages 710$_a$ and 710$_b$ that provide drive signals to a plurality of gain stages 720$_a$-720$_d$ (generically gain stage 720). As shown in FIG. 4A, the driver outputs of driver stages 710$_a$ and 710$_b$ are coupled to gain stages 720 through AC coupling capacitances $C_{ACL}$ and $C_{ACH}$, which are coupled in series to the parallel input lines to gain stages 720. Note further, a parallel inductance $L_D$ that is center tapped with a common mode voltage $V_{CM}$ is coupled to the output lines of stages 710$_a$ and 710$_b$ along with a matching capacitance, $C_{MT}$. As further shown, gain stages 720 may each be biased by bias voltages $V_{QPL}$ and $V_{QNL}$ and $V_{QPH}$ and $V_{QNH}$ for the respective low power gain stages and high power gain stages. By providing individual bias voltages to each input of each gain stage, each gain stage can be individually disabled (i.e., placed in a Hi-Z state using these bias voltages). In various embodiments, $C_{ACL}$ and $C_{ACH}$ can be adjusted so that the RF signal amplitudes on all inputs to gain stages 720 are equal. The bias voltages may be fed with large-valued resistors which, in one embodiment may be approximately on the order of 10 K Ohms.

Still referring to FIG. 4A, the amplified outputs of gain stages 720 may be coupled through a reconfigurable transformer 730 and provided to an output load $R_L$. As described above, in a low power mode of operation, gain stages 720$_a$ and 720$_d$ are activated and gain stages 720$_b$ and 720$_c$ are placed in a Hi-Z state, thus causing a turns ratio of transformer 730 to be $L_H+L_L+M_{HL}:L_2$, which may be approximately 1:1. (As before, $M_{HL}$ is the mutual of the primary coils which enhances the total L of the primary). Instead in a high power mode, gain stages 720$_a$ and 720$_d$ are disabled (i.e., in a Hi-Z state) and gain stages $720_b$ and $720_c$ are activated, thus providing an impedance ratio of $L_H$:$L_2$. Note the presence of matching parallel capacitances $C_{ML}$ and $C_{MH}$ at the output of gain stages 720, and a corresponding matching capacitance $C_L$ coupled in parallel to the secondary of transformer 730. While shown with this particular implementation in the embodiment of FIG. 7A, the scope of the present invention is not limited in this regard.

Figure 4B:
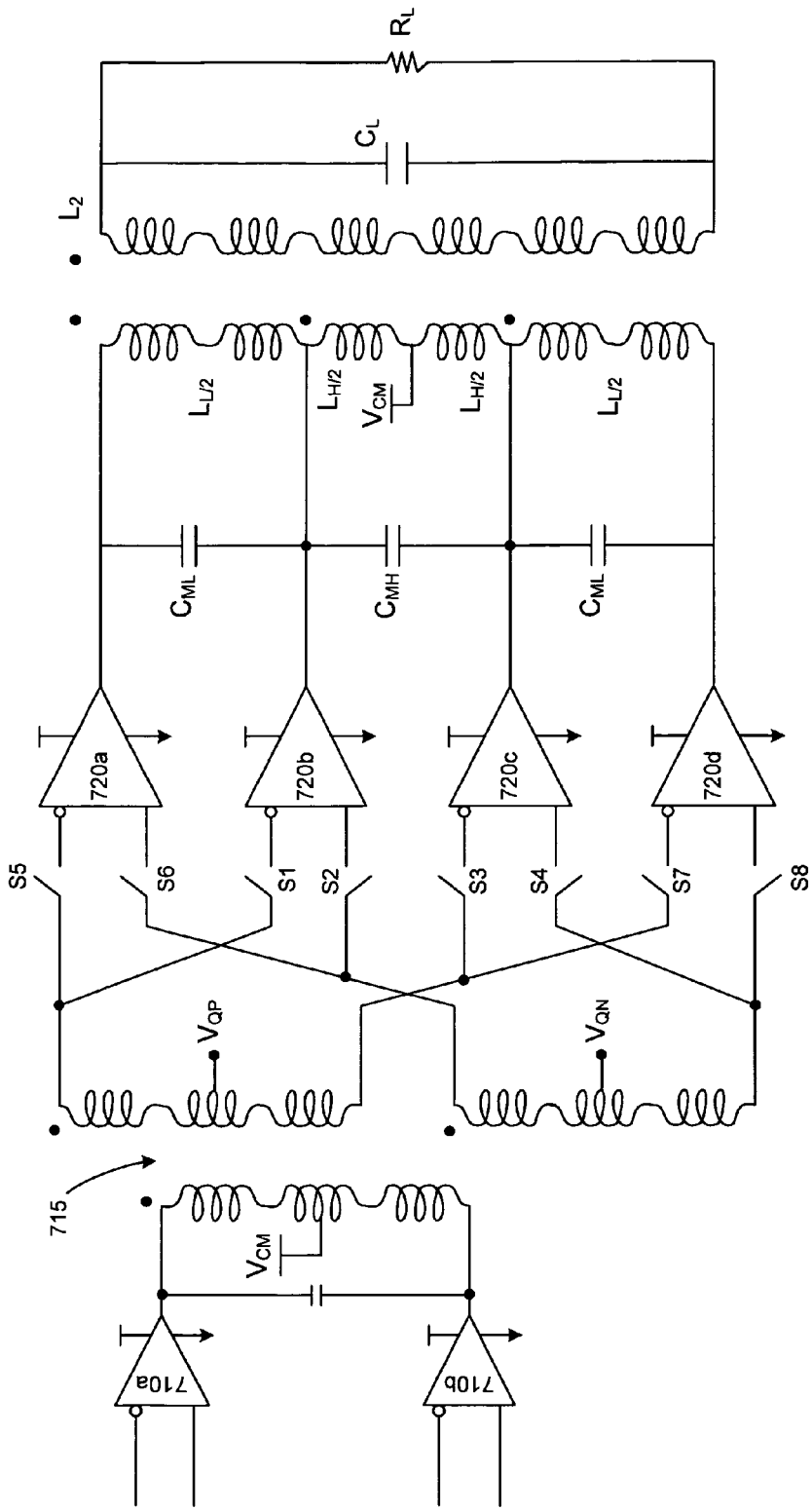
FIG. 4B is another conceptual schematic diagram of parallel gain stages and an output network in accordance with an embodiment of the present invention.

For example, in other implementations a similar output network may be provided with an input transformer to provide the drive signals to the gain stages. Specifically, as shown in FIG. 4B, circuit 700' may be adapted similarly to that of FIG. 4A. However, note that a first transformer 715 may be provided that couples signals from driver stages $710_a$ and $710_b$ to gain stages 720. Note in this embodiment, the primary of transformer 715 is center tapped with a common mode voltage $V_{CM}$ and the multiple secondaries of transformer 715 are center tapped with bias voltages $V_{QP}$ and $V_{QN}$, respectively.

Note that in the embodiment of FIG. 4B, the need for coupling capacitances on the input lines to gain stages 720 can be avoided, providing for higher gain in the gain stages. Furthermore, by controlling the turns ratio of input transformer 715, voltage gain can be realized. Furthermore, as described above, bias implementation can be eased by providing a single bias voltage for all NMOS and PMOS devices. Note that switches S1-S4 are provided to switch on or off the high power gain stages $720_b$ and $720_c$ when switching between power modes. Similarly, switches S5-S8 may switch on or off the low power stages $720_a$ and $720_d$.

Figure 4C:
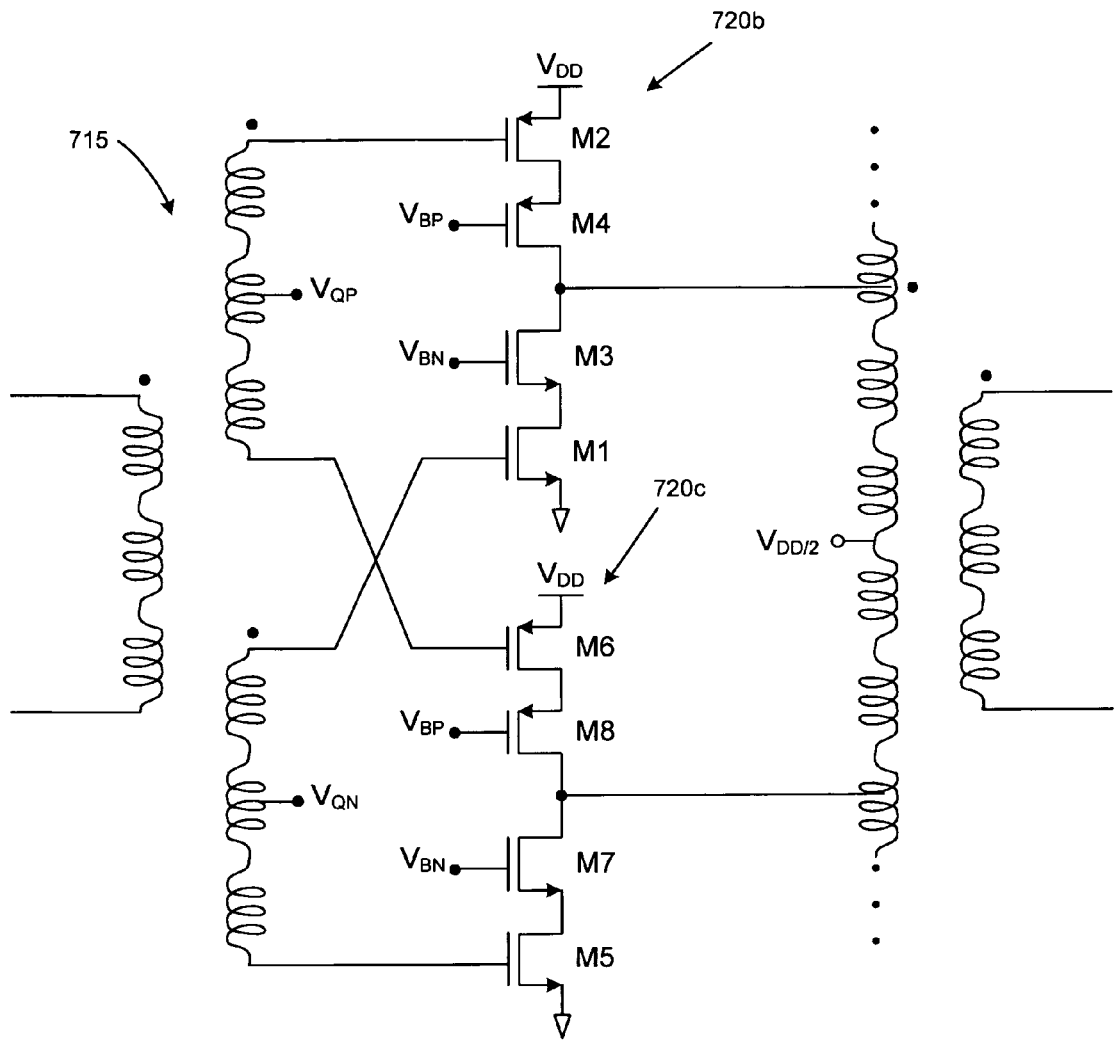
FIG. 4C is a conceptual schematic diagram of an alternate input coupling to a gain stage in accordance with one embodiment of the present invention.

To avoid switch losses due to these switches, in another implementation, cascoded output stages may be provided. Referring now to FIG. 4C, shown is a conceptual schematic diagram of the high power gain stages $720_b$ and $720_c$, which are provided with cascode devices that are driven by the outputs of the two secondary coils of input transformer 715. Thus as shown in FIG. 4C, circuit 700" shows only the two high power gain stages $720_b$ and $720_c$. However, similar cascoding may be realized on the low power gain stages. Specifically as shown in FIG. 4C, gain stage $720_b$ includes a NMOS device M1 and a PMOS device M2 coupled as a complementary transconductance amplifier. As further shown, each of these devices has a corresponding cascode device M3 and M4 coupled thereto, each of which is driven with the corresponding bias voltage $V_{BN}$ and $V_{BP}$, respectively. Similar cascode devices M7 and M8 are cascoded to the complementary amplifier of gain stage $720_c$, formed of NMOS and PMOS devices M5 and M6, respectively. By controlling the bias voltages $V_{BP}$ and $V_{BN}$, the corresponding cascode devices can be disabled (i.e., in a Hi-Z state) while the shared output center tap voltage $V_{QP}$ and $V_{QN}$ remains on for the other paths (i.e., the low power path not shown in FIG. 4C). In this way, gain stages 720 can tolerate higher swings, and the need for a voltage regulator can be avoided. Furthermore, other transconductance devices, such as thin oxide devices can be used. Further, while not shown in FIG. 4C, understand that the center taps on the secondaries of input transformer 715 can be shared by the other gain stage paths.

Figure 5A:
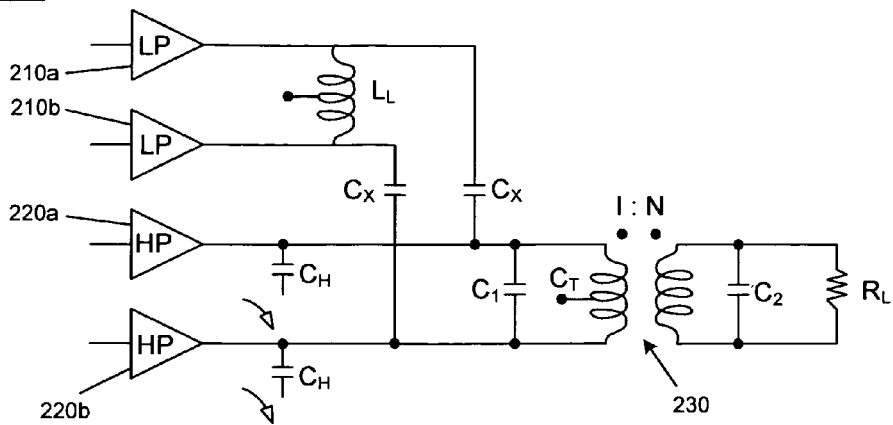
FIG. 5A is a conceptual schematic diagram of a reconfigurable output network in accordance with another embodiment of the present invention.

Referring now to FIG. 5A, shown is a conceptual schematic diagram of a reconfigurable output network in accordance with another embodiment of the present invention. As shown in FIG. 5A, output network 200 includes multiple paths, including a first path having amplifiers $210_a$ and $210_b$, and a second path including differential amplifiers $220_a$ and $220_b$. Generally, path 210 having amplifiers $210_a$ and $210_b$ may correspond to a low power path and path 220 including amplifier $220_a$ and $220_b$ may correspond to a high power path. As shown in FIG. 5A, these parallel paths are coupled to a primary of a transformer 230 that in turn has a secondary coupled to an output load, $R_L$. In the embodiment shown in FIG. 5A, a turns ratio of transformer 230 may be 1:N. Note that the primary of transformer 230 may be center tapped.

Referring still to FIG. 5A, low power path 210 may have an inductance $L_L$ coupled in parallel across the outputs of amplifiers $210_a$-$210_b$. Furthermore, series capacitances $C_X$ may couple low power path 210 to a primary of transformer 230. In turn, high power path 220 may have switchable capacitances $C_H$ coupled to the outputs of each of amplifiers 220. In addition, an input matching capacitance C1 may be coupled in parallel to the primary of transformer 230. In turn, an output matching capacitance C2 may be coupled to the secondary of transformer 230, in parallel with the output load $R_L$.

Figure 5B:
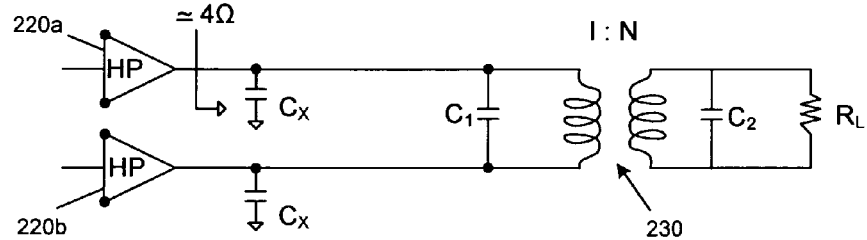
FIG. 5B is an equivalent schematic of the circuit of FIG. 5A in a high power mode of operation.

Referring now to FIG. 5B, shown is an equivalent schematic in a high power mode of operation in which high power path 220 is active and low power path 210 in inactive. As shown in FIG. 5B in the high power mode, the switchable capacitances may be opened and low power path 210 may be placed in a Lo-Z power state, causing the effective capacitances $C_X$ to be coupled in shunt to the outputs of amplifiers $220_a$ and $220_b$. In this way, a relatively low impedance, depending on the turns ratio of the transformer, may be realized by effectively placing low power path 210 into the Lo-Z state.

Figure 5C:
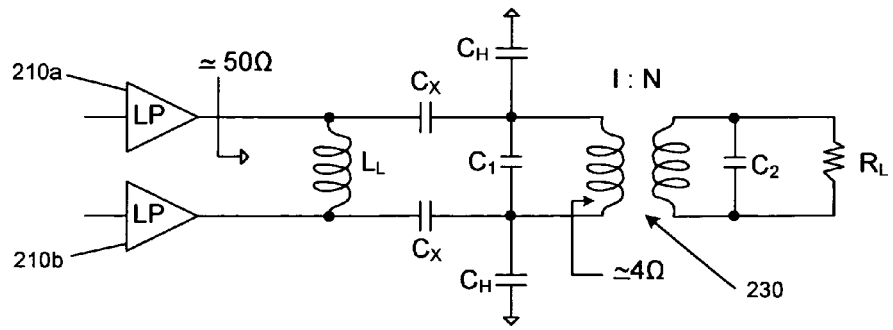
FIG. 5C is an equivalent schematic of the circuit of FIG. 5A in a low power mode of operation.

Referring now to FIG. 5C, shown is an equivalent schematic for the low power mode of operation. As shown in FIG. 5C, in a low power mode of operation, low power path 210 is activated, and high power path 220 may be placed into a Hi-Z state. Additionally, the switchable capacitances $C_H$ may be added in shunt with the primary of transformer 230 by closing the switches. As low power path 210 is activated, inductor $L_L$ is also switched in parallel, along with the series-connected capacitances $C_X$, thus providing a further impedance transformation. In this embodiment, transformer 230 provides the same turns ratio in low power mode as in the high power mode. However, the presence of capacitors $C_X$ and inductor $L_L$ acts as a second impedance transformer to provide another impedance transformation to thus set a load impedance, as seen at the output of amplifiers $210_a$ and $210_b$. In some embodiments, this load may be approximately 50 ohms, thus setting the maximum output power in the low power mode. Thus in low power mode, there are two impedance transformations, from a nominal 50Ω to an intermediate lower impedance and from the intermediate impedance to a higher final load impedance. This may cause higher loss in low power mode. In low power mode, the inductor $L_L$ typically dominates loss in the second transformation. While shown with this particular implementation in the embodiment of FIGS. 5A-5C, understand the scope of the present invention is not limited in this regard. For example, additional pull down NMOSs may be connected to the outputs of the low power amplifiers $210_a$ and $210_b$ to lower impedance. Still further, in other embodiments, the switchable capacitances $C_H$ may be controlled to be switched in or out when the high power mode is enabled. Additionally, the switchable capacitor may be combined with a fixed-valued capacitor to provide a controlled range of capacitance. Generalizing the concept illustrated in FIG. 5A, yet another parallel path can be provided for even lower power output connected through another transformation network to the transformer 230.

Figure 6A:
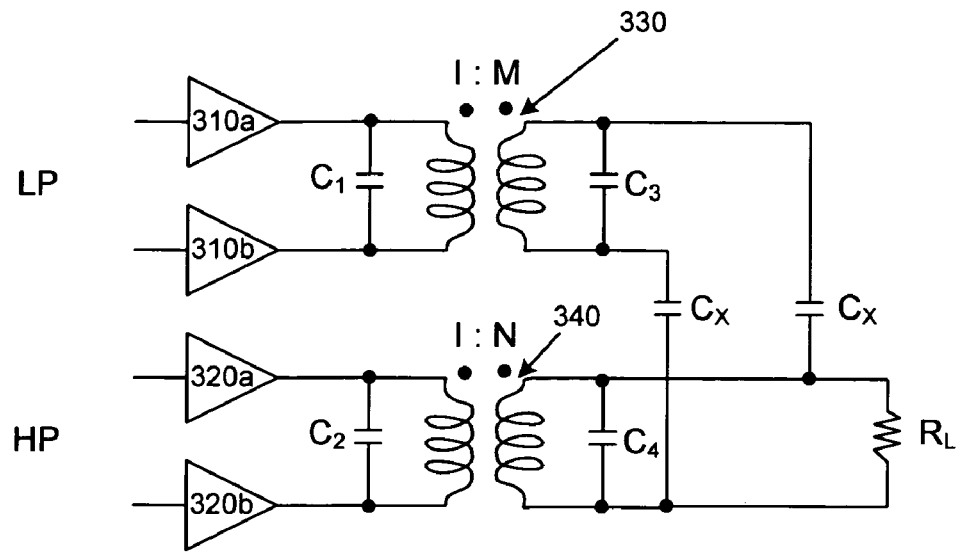
FIG. 6A is a conceptual schematic diagram of a reconfigurable output network in accordance with another embodiment of the present invention.

Referring now to FIG. 6A, shown is a conceptual schematic diagram of a reconfigurable output network in accordance with another embodiment of the present invention. As shown in FIG. 6A, output network 300 includes parallel low power and high power paths. Specifically, the low power path includes amplifiers 310$_a$ and 310$_b$, which may be differential amplifiers coupled to a primary of a first transformer 330 having a turns ratio of 1:M. Note that matching capacitances C$_1$ and C$_3$ are coupled in parallel to the primary and secondary, respectively. As further shown in FIG. 6A, the secondary of transformer 330 is also coupled through serial capacitances C$_x$ to a load R$_L$. In turn, the high power path is coupled to this load. Specifically as shown in FIG. 6A, high power amplifiers 320$_a$ and 320$_b$ are coupled to a primary of a second transformer 340 having a turns ratio of 1:N. Note the presence of matching capacitances C$_2$ and C$_4$ on the primary and secondary, respectively. By controlling which signal path is active, different impedances may be seen at the output of amplifiers 310 and 320, thus enabling operation in different power modes. In an example embodiment, transformer 330 may have a turns ratio of 1:1, and transformer 340 may have a turns ratio of 1:4.

Figure 6B:
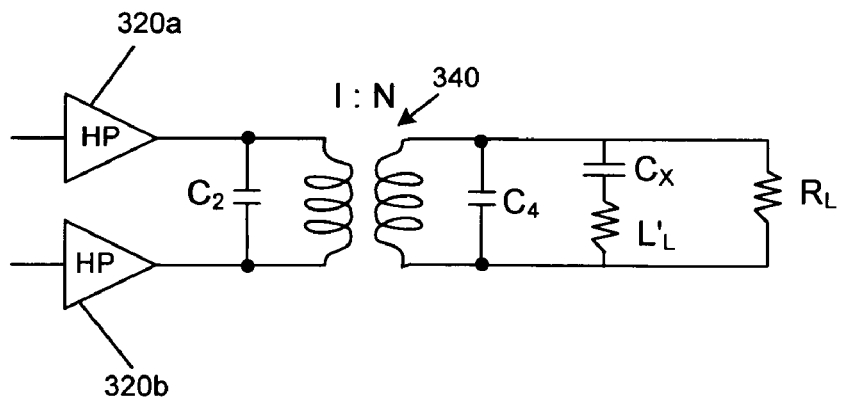
FIG. 6B is an equivalent schematic of the circuit of FIG. 6A in a high power mode of operation.

Specifically, when in high power mode the low power path is placed in a Lo-Z state. Referring now to FIG. 6B, shown is a conceptual schematic diagram showing an equivalent circuit of output network 300 in a high power mode. As shown in FIG. 6B, in the high power mode the high power path through transformer 340 is connected. In addition, a parallel capacitance C$_x$, representing the series capacitance shown in FIG. 6A, is present in series with an inductance L$_L$', which corresponds to the net inductance on the secondary side of transformer 330 when the low power path is in the Lo-Z state. Accordingly, in this mode the impedance seen at the output of amplifiers 320$_a$ and 320$_b$ may be low, for example approximately 4 ohms.

Figure 6C:
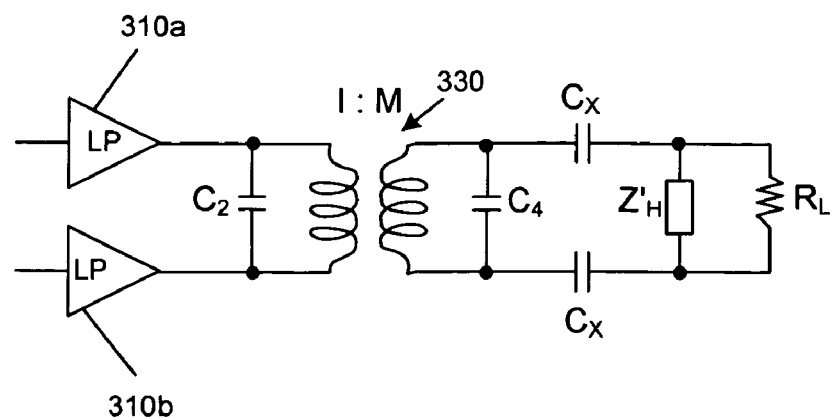
FIG. 6C is an equivalent schematic of the circuit of FIG. 6A in a low power mode of operation.

Referring now to FIG. 6C, shown is a conceptual schematic diagram showing circuit 300 in a low power mode of operation. As shown in FIG. 6C, in low power mode, the high power path may be placed in a Lo-Z state or a Hi-Z state. In either case, an impedance Z$_H$' may be in parallel with the load resistance and which corresponds to impedance on the secondary of transformer 340 when the high power path is off. Also note that the serial capacitances C$_x$ are coupled between the secondary of transformer 330 and the load. Thus in low power mode, an intermediate impedance, as seen by the secondary winding of transformer 330, can be provided that is more unconstrained than that of FIG. 5C, discussed above. For example, in some implementations this low power mode intermediate impedance may be closer to the load resistance, e.g., 25Ω. While not shown in the embodiment of FIGS. 6A-6C, in some implementations switchable capacitances may be provided on the primary or secondary side of the transformers, similar to that shown in the high power path of circuit 200 described above with regard to FIG. 5A.

Figure 6D:
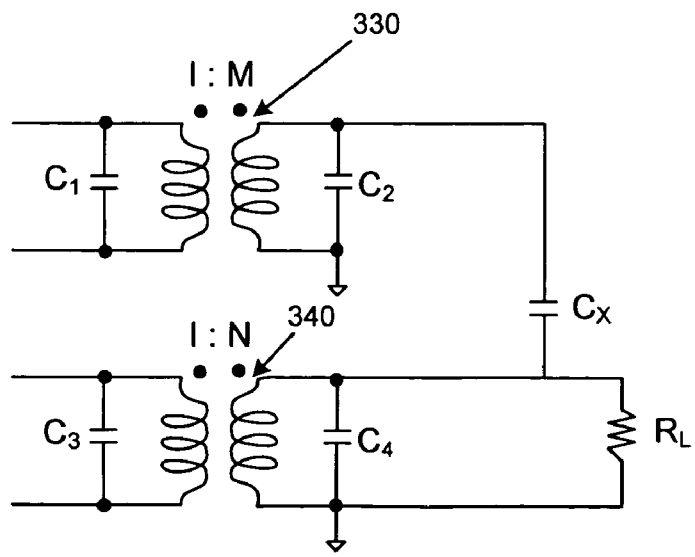
FIG. 6D is a conceptual schematic diagram showing a single ended implementation of a reconfigurable output network in accordance with one embodiment of the present invention.

FIG. 6D shows a single-ended implementation. Specifically, circuit 350 as shown in FIG. 6B includes the same transformers and parallel matching capacitances. However, note that only a single series matching capacitance C$_x$ couples the secondary of transformer 330 to the output load R$_L$. While not shown for ease of illustration in FIG. 6D, understand that the multiple amplifiers, for example in FIG. 6A, may be coupled to the primaries of the two transformers.

Generalizing the concept illustrated in FIG. 6A, yet another parallel path for even lower power output can be connected through yet another transformation network to the transformer 340.

Figure 7:
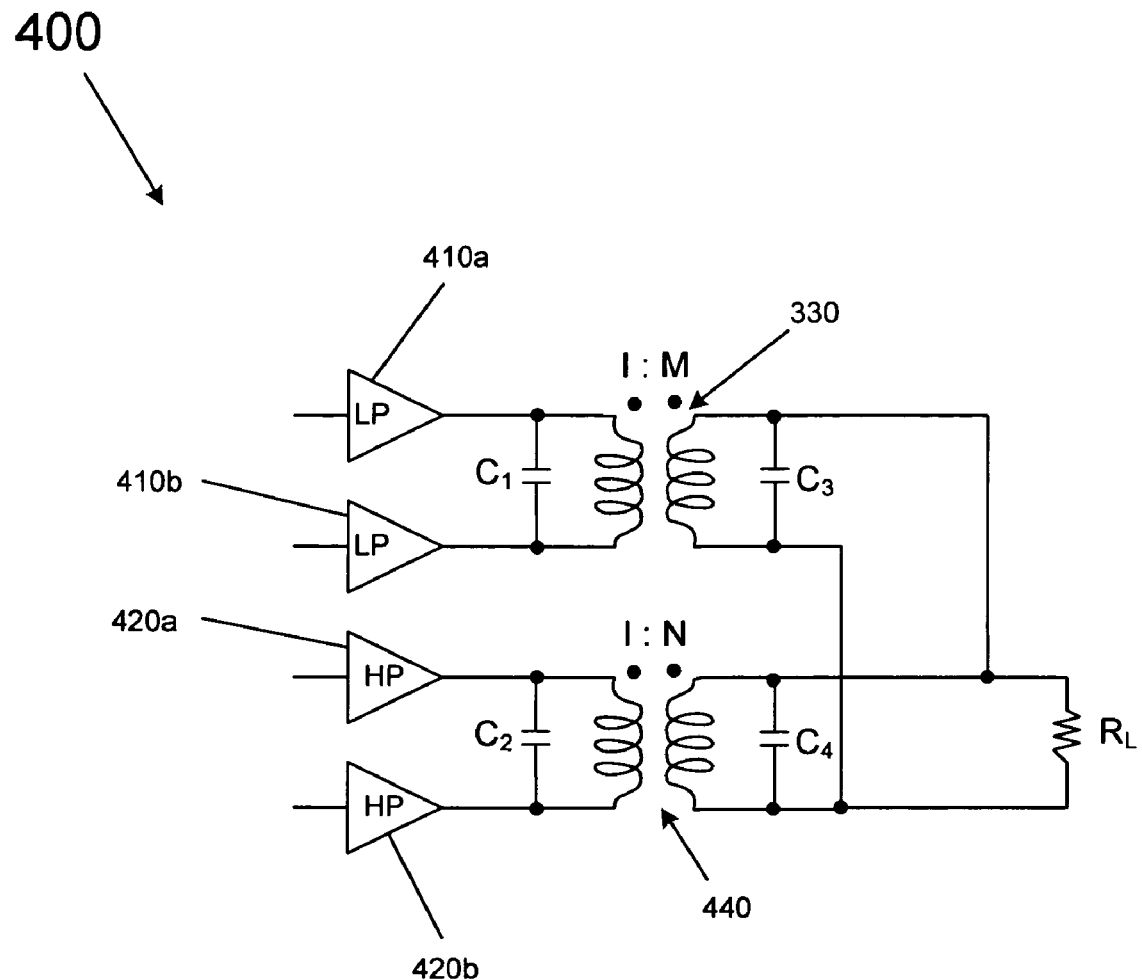
FIG. 7 is a conceptual schematic diagram of a reconfigurable output network in accordance with another embodiment of the present invention.

Referring now to FIG. 7, shown is another conceptual schematic diagram of an output network 400 including a low power path 410 and a high power path 420, configured similar to output network 300 of FIG. 6A. However, in the embodiment of FIG. 7, the series matching network (shown as series capacitances C$_x$ in FIG. 6A) is not present.

Note that as paths are turned off, the amplifiers can be Hi-Z or Lo-Z. In one implementation transformer 440 may have a turns ratio to provide a low load impedance to amplifiers 420$a$ and 420$b$, for example 1:4, and transformer 430 may have a turns ratio to provide a higher load impedance to amplifiers 410$a$ and 410$b$, for example 1:1. In this case, the amplifiers 410$a$ and 410$b$ can be placed in Lo-Z mode when disabled to avoid damage. When a path is in Lo-Z, the transformer from the unused path becomes an inductor of lower value than the winding inductance. For example, if a transformer has primary and secondary windings each having an inductance of L with an unloaded quality factor Q, then with a Lo-Z state on the primary, the equivalent shunt inductance value is approximately L/2 with an effective quality factor of Q/2 (approximately). A similar implementation can be realized as a single-ended circuit.

This shunt inductance of the unused path can be tuned out by capacitors, which may be located on the secondary side, in various embodiments, although voltage concerns may cause the tuning capacitors to be switchable capacitors in the primary side, although switchable capacitors on the primary may increase losses. In some cases, the shunt inductance from the unused path can increase losses. This can be improved by increasing the winding inductance, since R$_P$≈ω$_o$LQ, where R$_P$ is the parallel equivalent loss of an inductor. By increasing L, the network losses are decreased. However, by increasing the winding inductance, the losses are increased when the transformer in question is "active." Thus, there may be a trade-off between those losses. Generalizing the concept illustrated in FIG. 7, yet another parallel path can be provided for even lower power output connected to the secondary winding of transformer 440.

Figure 8A:
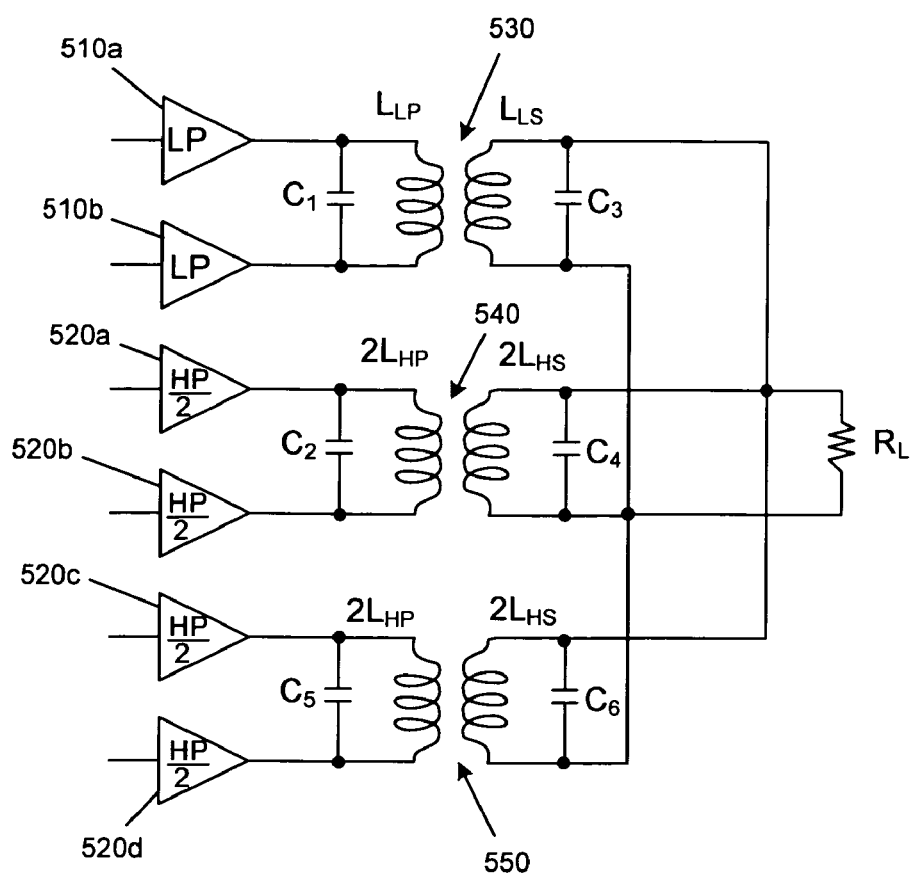
FIG. 8A is a conceptual schematic diagram of a reconfigurable output network in accordance with yet another embodiment of the present invention.

In other implementations, because transformers can become more difficult to implement on die as winding inductances become smaller, as will be described further below with regard to FIGS. 9A and 9B, at least the high power path may be split into a plurality of parallel paths. Referring now to FIG. 8A, shown is a conceptual schematic diagram of an output network in accordance with yet another embodiment of the present invention. As shown in FIG. 8A, circuit 500 may be configured similarly to that discussed above with regard to FIG. 7. However, in the implementation of FIG. 8A, the high power path is split into two parallel paths, namely a first high power path including differential amplifiers 520$_a$ and 520$_b$ having outputs coupled to a primary of a first high power transformer 540, and a second high power path having differential amplifiers 520$_c$ and 520$_d$ having outputs coupled to a second high power transformer 550. Note that in the embodiment of FIG. 8A, the winding inductances on both coils of the high power transformers 540 and 550 may have a value of 2L$_{Hp}$:L$_{Hs}$, where L$_{Hp}$ is a primary inductance of a high power path (e.g., the single high power path shown in FIG. 7) and L$_{Hs}$ is a secondary inductance. In turn, the coils of low power transformer 530 having a primary coil connected to the output of differential amplifiers 510$_a$ and 510$_b$, and a secondary coil may have winding inductances of L$_{Lp}$ and L$_{Ls}$, corresponding to the low power path winding inductances. As shown in FIG. 8A, the secondaries of each of transformers 530, 540 and 550 is coupled to the output load R$_L$.

Figure 8B:
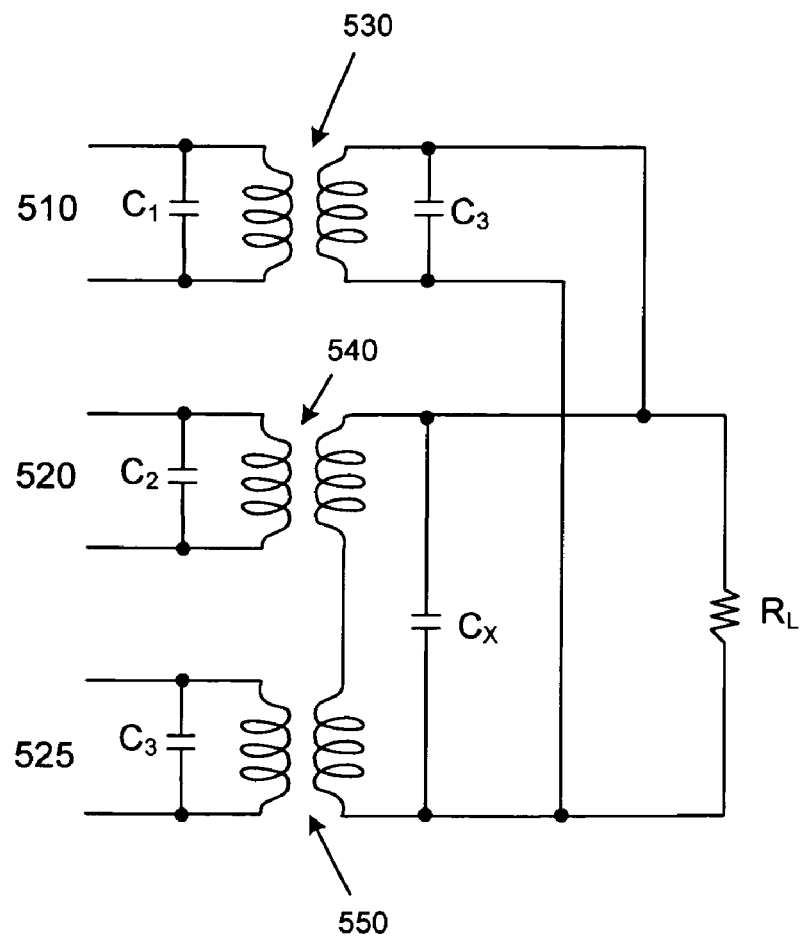
FIG. 8B is a conceptual schematic diagram of alternate implementation of the reconfigurable output network of FIG. 8A.

In this implementation the high power amplifier areas are each half that of a single high power path (such as that of FIG. 7). By halving the amplifiers, the output capacitance is halved, and the required drive-point (load) impedance is doubled. As such, the transformer windings are doubled. Typically in high power mode, all high power amplifiers 520$a$-520$d$ are simultaneously enabled. High power/low power operation is otherwise the same as described above in FIG. 7. Splitting the high power path may also provide additional power mode(s), if one pair of high power amplifiers, 520*a* and 520*b* for example, are disabled while the other pair 520*c* and 520*d* are enabled. There are other alternatives that exist which may increase winding inductances in the high power path, while keeping the low loss topology for the low power path. For example, referring now to FIG. 8B, shown is an alternate implementation of parallel high power paths 520 and 525, in addition to a low power path 510. As shown in FIG. 8B, each path is coupled to an independent transformer 530, 540 and 550. Note however, that the secondaries of transformers 540 and 550 are coupled together in series, and the matching capacitance $C_y$ is coupled in parallel across the secondary of transformer 530, while matching capacitance $C_x$ is coupled in parallel across the combined secondaries of transformers 520 and 525. In other respects, circuit 500' may operate the same as circuit 500, discussed above.

A transformer in accordance with an embodiment of the present invention may be fabricated in various manners. For example, the primary and secondary windings may each be formed on a metal redistribution layer (RDL). Typically, RDL is formed with relatively thick copper in a "post-processing" step. In contrast, the metal layers provided as part of the standard IC process are typically thinner and may be made of aluminum or copper. Alternatively, all winding may be formed in the standard IC metal layers. The windings may in one embodiment be physically configured as smooth spirals or substantial spirals, such as octagonal or square spirals, or another such shape. In one embodiment, the primary winding may be on a lower RDL layer, and the secondary (output winding) formed on an upper RDL layer, or a combination of RDL and IC metal layers.

As mentioned above, inductance values used in a PA for transformer coils, filters or so forth, can be small, which can be physically difficult to implement in a reliable manner. For example, depending on the supply voltage, desired output power and operating frequency, a winding inductance can be as small as 150 picoHenries (pH). To implement such small values robustly an output stage can be split into at least two equal halves. This doubles the inductor value that needs to be used, making for a robust implementation, making the network less sensitive to various parasitic elements.

By placing multiple inductors in parallel, each inductor has a larger value, e.g., double the value if a pair of inductors are in parallel and there is no mutual inductance. Such inductors may take up twice the amount of area and may be easier to accurately implement. For planar inductors placed next to each other, the magnetic coupling coefficient, k, is quite small (approximately 0.05 or less). A positive k tends to enhance the value of the final effective inductance ($L_{eff}$), making this effective inductance, $L_{eff}$ greater than 150 pH for example. However, (especially in a differential PA), one could change the flow of current (i.e., clockwise to anti-clockwise) and make k negative, which will decrease $L_{eff}$. With large geometries, a predictable decrease in inductance can be realized, and the achievable Q may be higher as well, depending on the implementation of the inductors.

Note that only parts of a transformer, e.g., only the primary may have multiple coils in parallel, while the secondary is a single coil. This serves the purpose of combining two parallel paths into a single (secondary) output port as well.

As frequencies get higher (i.e., multi-GHz operation) the inductance (L) and/or capacitance (C) values must get smaller for tuned (resonant) networks. The C is also constrained by the required output power that needs to be delivered (and the chosen technology). A specified output power will imply a transistor area, which in turns implies an amplifier output capacitance. This output capacitance sets a lower limit on C. Hence, as frequency increases, the inductances must become smaller for tuned networks.

Figure 9A:
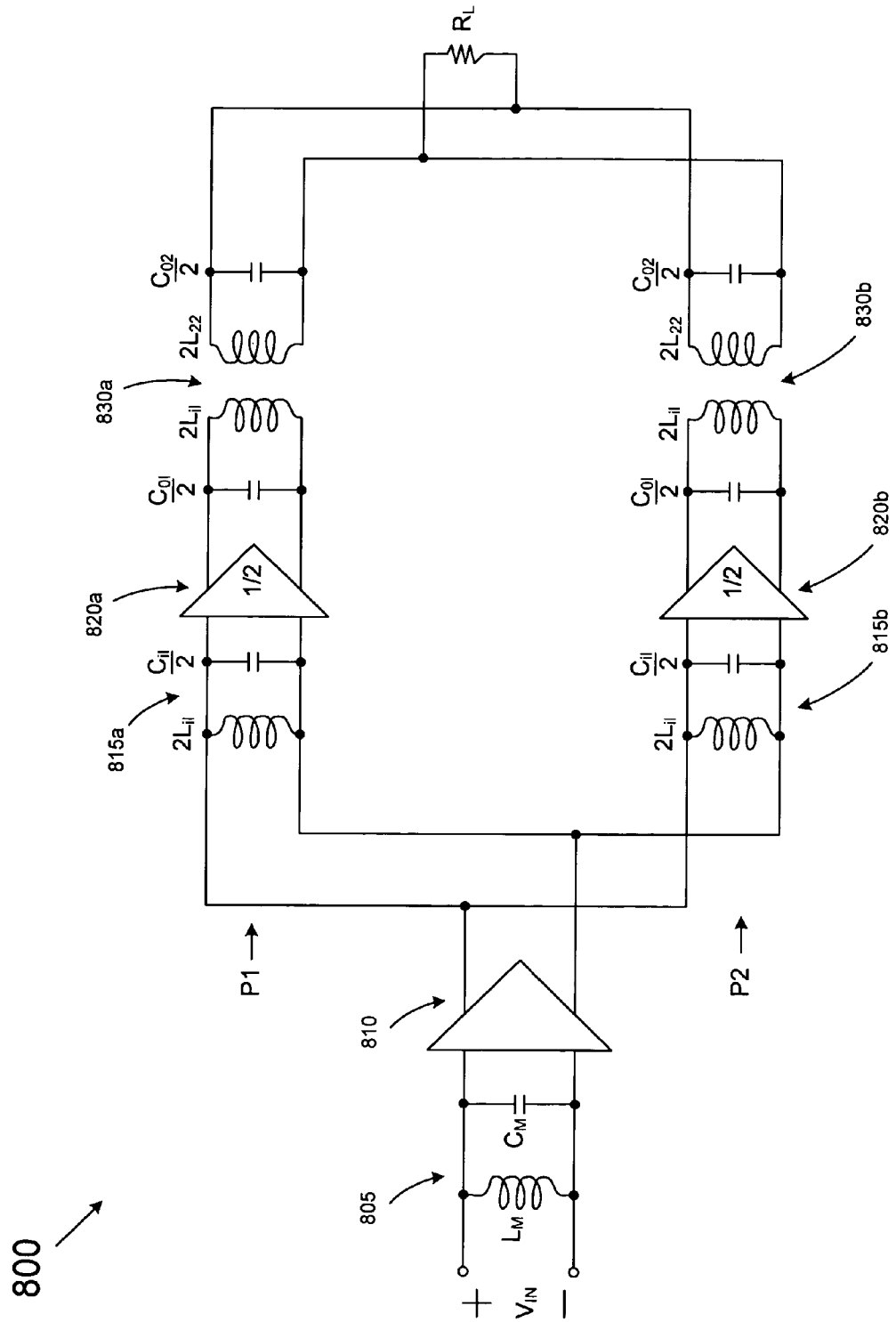
FIG. 9A is a conceptual schematic diagram of a power amplifier in accordance with one embodiment of the present invention.

Referring now to FIG. 9A, shown is a conceptual schematic diagram of a power amplifier in accordance with one embodiment of the present invention. As shown in FIG. 9A, power amplifier 800 includes a driver stage 810 coupled to receive an incoming signal, $V_{in}$. As shown, an input matching network 805, formed of an inductance $L_M$ and a capacitance $C_M$ is coupled to the input signal line. Driver stage 810 may condition the incoming signal and pre-amplify it to a given level.

Referring still to FIG. 9A, power amplifier 800 includes an output stage that is split into two paths, namely a first path P1 and a second path P2. In the embodiment shown in FIG. 9A, these paths may have components of substantially equal values, the outputs of which are provided to an external output load, e.g., of 50 ohms. The two paths may have insignificant mutual coupling between them, but low coupling is not a required condition.

First signal path P1 includes an interstage matching network 815*a* including an inductance $2_{i1}$ and a capacitance $C_{i1}/2$ that is coupled to a gain stage 820$_a$. In this schematic representation, $C_{i1}/2$ may include the input capacitance of the amplifiers 820*a*, any parasitic shunt capacitance, and any required additional extrinsic capacitance. Note that the inductance value may be twice that if only a single path were present, while the capacitance value may be half that of a single path capacitance value. Furthermore, gain stage 820$_a$ may be sized with devices having half the size of those present in a single path implementation (and thus provide half the gain). Coupled to output gain stage 820$_a$ is an output matching capacitance $C_{O1}/2$, which again is half the value that would be present in a single path implementation. Again, the output capacitor $C_{O1}/2$ may include any amplifier output capacitance and any parasitic shunt capacitance, any required extrinsic capacitor.

Still referring to FIG. 9A, the output of gain stage 820$_a$ is coupled to a transformer 830$_a$. Note that transformer 830$_a$ may be formed of inductors that are twice the value as would be present in a single path implementation (namely $2L_{11}$ and $2L_{22}$). The secondary coil of transformer 830$_a$ is coupled to an output load. Transformer 830$_a$ may enable gain stage 820$_a$ to have a drive point impedance that is substantially less than an impedance of the output load. In addition, an output matching capacitance $C_{O2}/2$ is also coupled in parallel to the secondary coil of transformer 830$_a$. Similar components exist in the parallel path P$_2$. While shown with this particular implementation in the embodiment of FIG. 9A, understand the scope of the present invention is not limited in this regard.

Embodiments can be extended to more than two parallel paths, e.g., N paths. Assuming mutual inductances can be neglected, this would result in self-inductance values that are N times larger. If mutual inductances cannot be neglected, then the self-inductances would still be larger, but not exactly N times larger. The drivers and the capacitances are also N times smaller. The former (may) impact the area allocated to the inductors and it may be N times larger. A side benefit is that Q of the composite inductor is enhanced by providing more metal for the inductor. Yet another side benefit is the trace (parasitic) inductance is reduced by the same factor N. While the parasitic capacitance increases, this can be comprehended within the total capacitance needed (i.e., as part of the total capacitance that needs to be implemented).

As discussed above, in such a parallel combination of circuits, each gain stage can be individually controlled to enable/disable varying numbers of stages to scale the output power. As described above, one has to be careful about how the parallel stages are disabled. Ideally a disabled parallel stage should be an "open" or Hi-Z. One way to accomplish this in tuned bandpass systems is to turn off the output stage in a Hi-Z state, and simply resonate out the transformer with an appropriate capacitance.

Figure 9B:
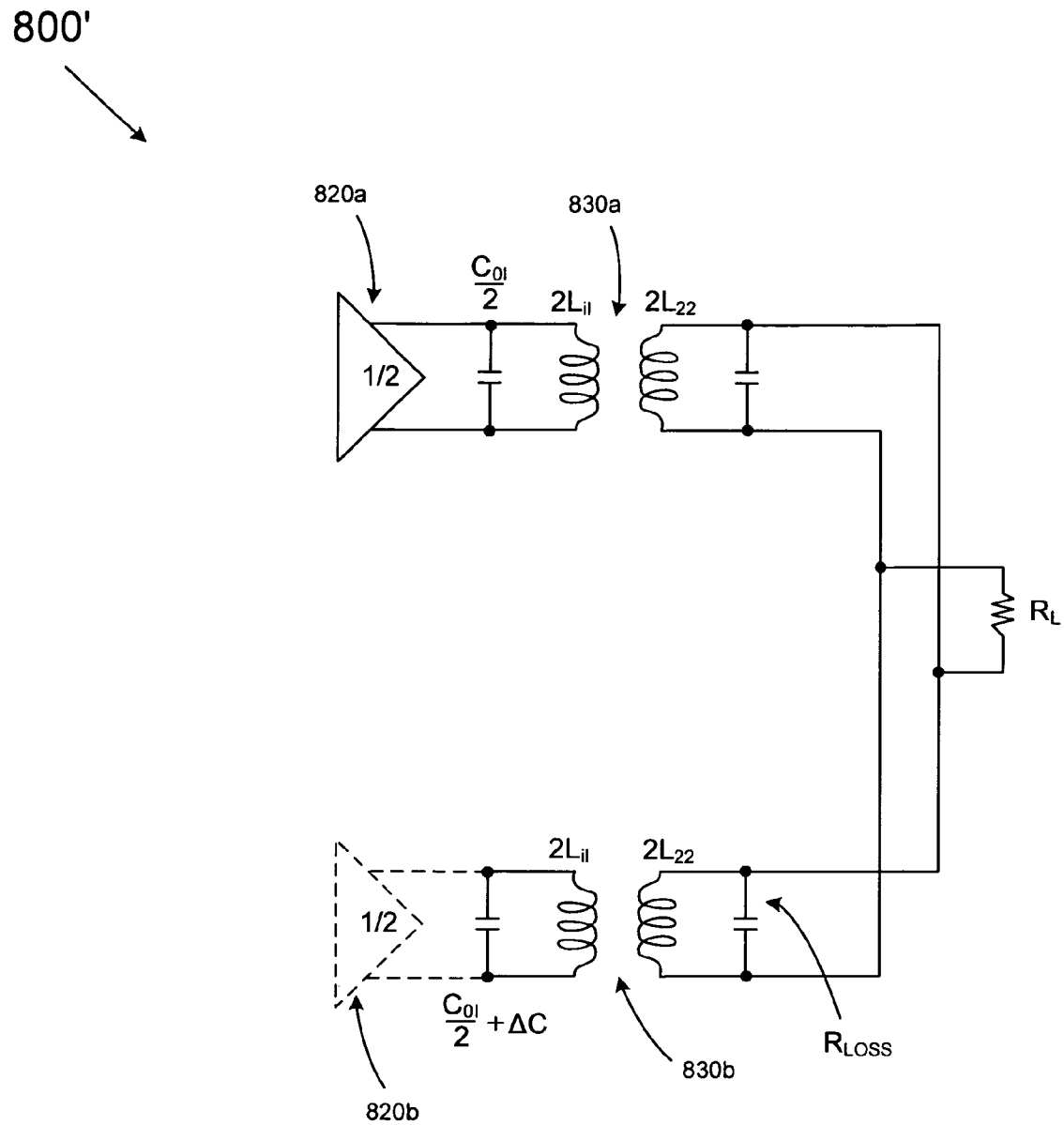
FIG. 9B is a conceptual schematic diagram of a portion of a power amplifier in accordance with yet another embodiment of the present invention.

Referring now to FIG. 9B, shown is a conceptual schematic diagram of a portion of a power amplifier in accordance with yet another embodiment of the present invention showing the details of a disabled gain stage. As shown in FIG. 9B, power amplifier 800', which may have similar parallel output stages to that of FIG. 9A, shows operation when one gain stage is disabled. When gain stage $820_b$ is disabled, as shown in FIG. 9B, there may be a small change in the output capacitance of the gain stage 820b, represented by ΔC. To compensate for this, ΔC can be added to path P2 so that the output network of the disabled path is properly resonant. Once the disabled path P2 is resonant, the net impedance of the disabled path is a loss term, $R_{loss}$. Note that in a parallel connection such as shown, the circuit being disabled is opened (or resonated out), while for a series connection, it may instead be shorted out.

Figure 10:
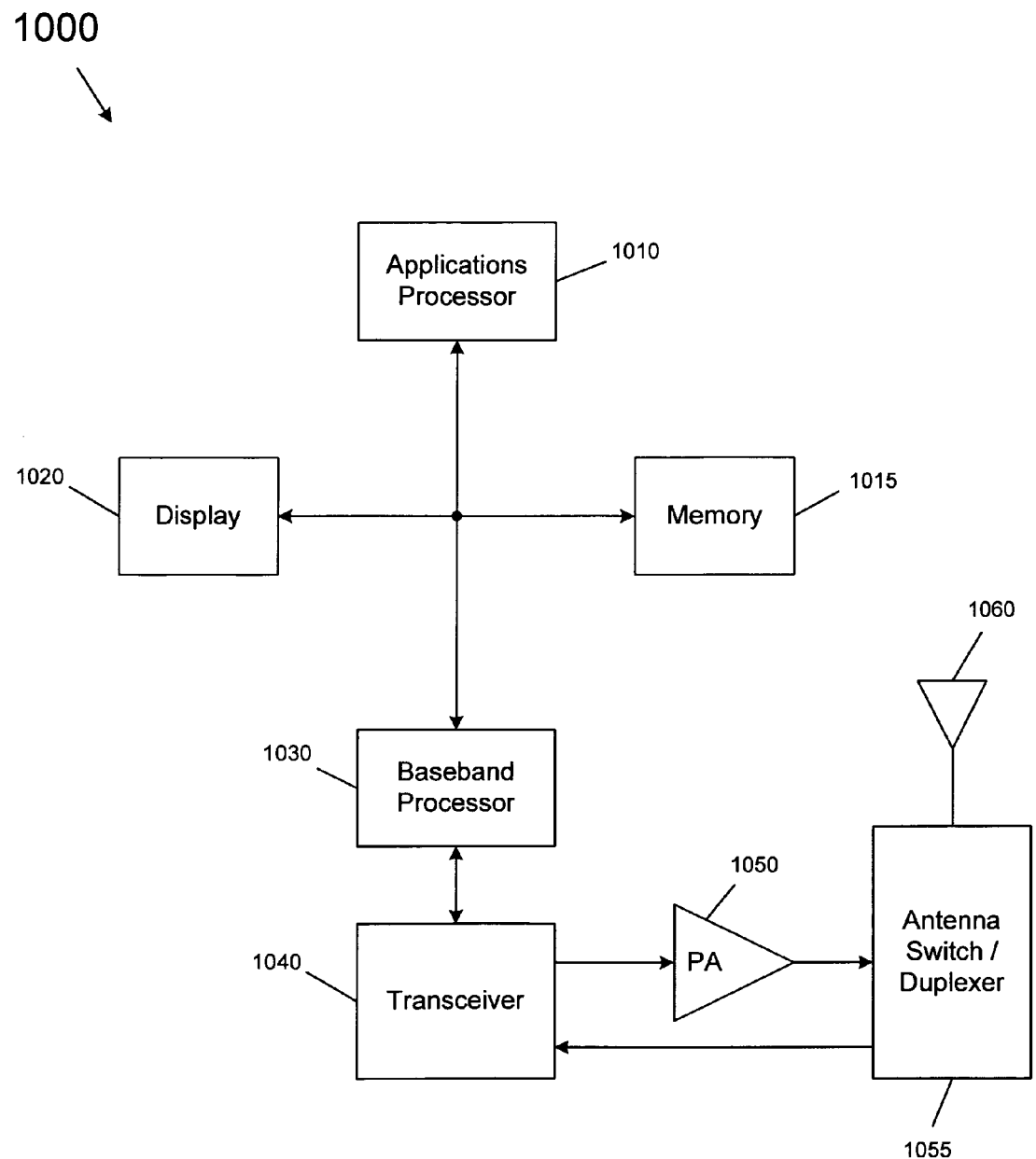
FIG. 10 is a block diagram of a wireless device in accordance with an embodiment of the present invention.

As described above, a reconfigurable output network in accordance with an embodiment of the present invention can be implemented in a PA such as a CMOS PA. Such a device can be used in various wireless systems, including handsets, mobile devices, PDAs and so forth. Referring now to FIG. 10, shown is a block diagram of a wireless device 1000 in accordance with an embodiment of the present invention. As shown in FIG. 10, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as EDGE or W-CDMA, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes one or more gain stages coupled to a reconfigurable output network as described above. In turn, PA 1050 may be coupled to an antenna switch, duplexer or both 1055 which in turn is coupled to an antenna 1060, which radiates the amplified RF signal.

In a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 10, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first gain stage having an input to receive a first input signal and to output a first amplified signal;
a second gain stage having an input to receive a second input signal and to output a second amplified signal;
an output network coupled to the first and second gain stages, and wherein at least one of the first and second gain stages is to be placed into a low impedance state when inactive, the output network including a transformer having a first coil and a second coil, wherein the outputs of the first and second gain stages are coupled to the first coil; and
a coupling capacitor to couple the output of the second gain stage to the first coil, wherein the coupling capacitor is configured in shunt with the first coil when the second gain stage is in the low impedance state and is coupled in series with the first coil when the second gain stage is active.

2. The apparatus of claim 1, wherein the first and second gain stages have substantially different drive point impedances when active.

3. The apparatus of claim 1, further comprising a switchable capacitance coupled to the output of the first gain stage, wherein the switchable capacitance is controllable to be enabled or disabled when the first gain stage is disabled.

4. The apparatus of claim 1, wherein the second gain stage comprises a pair of complementary amplifiers each having an output, and an inductor coupled in parallel between the outputs of the pair of complementary amplifiers.

5. The apparatus of claim 1, wherein when the first gain stage is enabled, a drive point impedance of the first gain stage is substantially less than an output impedance of an output load, and when the second gain stage is enabled, a drive point impedance of the second gain stage is substantially closer to the output impedance of the output load.

6. A power amplifier comprising:
a first stage including a first pair of amplifiers to receive a first input signal and to output a first amplified signal;
a second stage including a second pair of amplifiers to receive a second input signal and to output a second amplified signal;
a first transformer having a first coil to receive the first amplified signal and a second coil to output the first amplified signal to an output load; and
a second transformer having a third coil to receive the second amplified signal and a fourth coil to output the second amplified signal to the output load, the second transformer having a different turns ratio than the first transformer and wherein the turns ratio of the first transformer is greater than the turns ratio of the second transformer, wherein the first stage is a high power gain stage and the second stage is a low power gain stage.

7. The power amplifier of claim 6, wherein the fourth coil is capacitively coupled to the output load.

8. The power amplifier of claim 7, wherein the fourth coil is coupled to the output load by at least one coupling capacitor coupled in series between the fourth coil and the output load.

9. The power amplifier of claim 6, wherein when the second stage is inactive, the second stage is to be placed into a low impedance state, and a net inductance is effectively switched to be coupled in parallel to the second coil of the first transformer.

10. The power amplifier of claim 9, wherein when the first stage is inactive, the second coil is to act as an impedance coupled in parallel with the output load.

11. The power amplifier of claim 10, further comprising a switchable capacitance coupled to the first coil, wherein the switchable capacitance is effectively controlled to be enabled or disabled when the first stage is disabled.

12. The power amplifier of claim 10, further comprising a capacitance coupled to the second coil to tune out an inductance of the fourth coil when the second stage is inactive.

13. The power amplifier of claim 6, wherein the first transformer and the second transformer have a weak magnetic coupling.

14. An integrated circuit comprising:
a first gain stage having an input to receive a first input signal and to output a first amplified signal;
a second gain stage having an input to receive a second input signal and to output a second amplified signal;
a third gain stage having an input to receive a third input signal and to output a third amplified signal; and
at least three transformers each coupled to a corresponding one of the first, second and third gain stages, wherein the first and second transformers each have substantially equal turns ratios and wherein each of the substantially equal turns ratios is greater than a turns ratio of the third transformer.

15. The integrated circuit of claim 14, wherein each of the first, second, and third gain stages is individually enabled.

16. The integrated circuit of claim 15, wherein the first and second gain stages correspond to a high power gain path, and the third gain stage corresponds to a low power gain path.

17. The integrated circuit of claim 16, wherein the first and second gain stages are to be controlled in common to operate in a high power mode, wherein each of the first and second gain stages are sized to be substantially half of a single gain stage size needed to operate in the high power mode.

18. The integrated circuit of claim 14, further comprising a first matching capacitance coupled across outputs of the first and second transformers, the first and second transformers having serially connected output coils, and a second matching capacitance coupled across an output of the third transformer.

19. A power amplifier comprising:
a first differential complementary amplifier stage to receive an input signal and to amplify the input signal to a first amplified output signal;
a second differential complementary amplifier stage to receive the input signal and to amplify the input signal to a second amplified output signal;
an output transformer coupled to receive the first amplified output signal or the second amplified output signal, depending on which of the first and second differential complementary amplifier stages is enabled, wherein a turns ratio of the output transformer is dependent upon which of the first and second differential complementary amplifier stages is enabled, and wherein the non-enabled differential complementary amplifier stage is placed into a high impedance state; and
an input transformer having an input coil coupled to outputs of a driver stage and a pair of output coils each coupled to the first and second differential complementary amplifier stages, wherein the first differential complementary amplifier stage is switchably coupled to the pair of output coils.

20. The power amplifier of claim 19, further comprising a plurality of bias sources each coupled to one of the first and second differential complementary amplifier stages, wherein a voltage of the corresponding bias source is to place the corresponding differential complementary amplifier stage into the high impedance state.

21. The power amplifier of claim 19, wherein the first differential complementary amplifier stage includes a pair of complementary amplifiers, each having a first transconductance amplifier of a first polarity and a second transconductance amplifier of a second polarity each having a gate terminal coupled to one of the pair of output coils, a first cascode device coupled to an output terminal of the first transconductance amplifier and a first output of the first differential complementary amplifier gain stage, and a second cascode device coupled to an output terminal of the second transconductance amplifier and a second output of the first differential complementary amplifier stage, wherein the first and second cascode devices are each driven by a corresponding bias voltage.

22. The power amplifier of claim 19, further comprising a first matching capacitance coupled between an output of the driver stage and the input transformer, wherein the matching capacitance is controllable to compensate for a change in capacitance when the first differential complementary amplifier stage is disabled.

23. An integrated circuit comprising:
a first gain stage having an input to receive a first input signal and to output a first amplified signal;
a second gain stage having an input to receive a second input signal and to output a second amplified signal;
a first transformer coupled to the first gain stage; and
a second transformer coupled to the second gain stage, wherein the first and second transformers each have substantially equal first turns ratios and each of the first and second transformers include coils formed of inductors integrated on a complementary metal-oxide-semiconductor (CMOS) die of the integrated circuit including the first and second gain stages, and wherein the inductors are sized to manage inductance variation of a CMOS process on which the integrated circuit is fabricated.

24. The integrated circuit of claim 23, wherein the first and second transformers are to enable the first and second gain stages to have drive point impedances that are substantially lower than a load impedance of a load coupled to the first and second transformers.

25. The integrated circuit of claim 24, wherein each of the first and second transformers are sized to be substantially twice a size of a single transformer needed to operate in a high power mode in which the first and second gain stages are controlled in common.

26. The integrated circuit of claim 24, further comprising:
a third gain stage having an input to receive a third input signal and to output a third amplified signal; and
a third transformer coupled to the third gain stage, wherein a second coil of each of the first and second transformers is coupled in series and a second coil of the third transformer is coupled in parallel to the series-coupled second coils.

27. The integrated circuit of claim 26, further comprising a first matching capacitance coupled in parallel with the series-coupled second coils, and a second matching capacitance coupled in parallel with the second coil of the third transformer.

\* \* \* \* \*

UNITED STATES PATENT AND TRADEMARK OFFICE
CERTIFICATE OF CORRECTION

| | |
|---|---|
| PATENT NO. | : 7,728,661 B2 |
| APPLICATION NO. | : 12/151199 |
| DATED | : June 1, 2010 |
| INVENTOR(S) | : David E. Bockelman et al. |

Page 1 of 1

It is certified that error appears in the above-identified patent and that said Letters Patent is hereby corrected as shown below:

Column 16:
Line 20, "wherein the matching" should be --wherein the first matching--.

Signed and Sealed this

Third Day of August, 2010

David J. Kappos
*Director of the United States Patent and Trademark Office*